United States Patent [19]

Hirka et al.

[11] Patent Number: 5,041,979
[45] Date of Patent: Aug. 20, 1991

[54] BOUNDED SYNCHRONOUS ANGLE COUNTER

[75] Inventors: Gerald M. Hirka, Chicago; Donald W. Zerrien, Elgin; James W. Kopec, Winfield, all of Ill.

[73] Assignee: Motorola, Inc., Schaumburg, Ill.

[21] Appl. No.: 370,158

[22] Filed: Jun. 21, 1989

Related U.S. Application Data

[63] Continuation of Ser. No. 103,861, Oct. 1, 1987, abandoned, which is a continuation-in-part of Ser. No. 36,049, Apr. 8, 1987, Pat. No. 4,814,704.

[51] Int. Cl.$^5$ .................. F02P 9/00; G01M 15/00
[52] U.S. Cl. ..................... 364/431.04; 364/571.01; 123/414; 73/116
[58] Field of Search .......... 364/559, 569, 431.04, 364/571.01; 123/414, 416, 417; 73/116; 718/600, 603; 340/870.19, 870.23, 870.24

[56] References Cited

U.S. PATENT DOCUMENTS

| | | | |
|---|---|---|---|
| 4,152,655 | 5/1979 | Przybyla et al. | 328/120 |
| 4,231,091 | 10/1980 | Motz | 123/417 |
| 4,233,592 | 11/1980 | Leichle | 250/231 SE |
| 4,236,214 | 11/1980 | Sasayama | 364/431.04 |
| 4,241,708 | 12/1980 | Javeri | 123/418 |
| 4,257,377 | 3/1981 | Kinugawa et al. | 123/492 |
| 4,262,251 | 4/1981 | Fujishiro et al. | 324/208 |
| 4,273,089 | 6/1981 | Maier | 123/416 |
| 4,321,580 | 3/1982 | Deleris | 340/870.24 |
| 4,338,813 | 7/1982 | Hunninghaus et al. | 73/116 |
| 4,338,903 | 7/1982 | Bolinger | 123/476 |
| 4,378,004 | 3/1983 | Petrie | 123/643 |
| 4,385,605 | 5/1983 | Petrie et al. | 123/414 |
| 4,414,946 | 11/1983 | Däumer et al. | 123/414 |
| 4,485,784 | 12/1984 | Fuji et al. | 123/416 |
| 4,494,518 | 1/1985 | Katayama | 123/612 |
| 4,553,208 | 11/1985 | Akiyama et al. | 364/431.05 |
| 4,553,426 | 11/1985 | Capurka | 123/414 |
| 4,572,151 | 2/1986 | Toyama | 123/622 |
| 4,607,523 | 8/1986 | Takahashi et al. | 73/116 |
| 4,626,682 | 12/1986 | Hars et al. | 250/231 SE |
| 4,707,791 | 11/1987 | Hmelovsky et al. | 364/569 |

FOREIGN PATENT DOCUMENTS 7812993 5/1978 France.

OTHER PUBLICATIONS

Prior Art known to be used by General Motors and Stanadyne.
High Data "HCR" Spark Ignition.

Primary Examiner—Parshotam S. Lall
Assistant Examiner—V. Trans
Attorney, Agent, or Firm—Phillip H. Melamed

[57] ABSTRACT

An angle measuring device is described for accurately indicating the position of the rotor relative to the reference position in view of perceived changes of rotor speed. The measuring device includes a sensor for detecting the markings and generating a sensor signal in response thereto; an angle counter, responsive to the sensor, for generating a position signal; and a correction circuit, responsive to the sensor signal, for correcting the position signal. The position signal is corrected in response to the sensor signal so as to provide an accurate indication of the position of the rotor.

15 Claims, 6 Drawing Sheets

BOUNDED SYNCHRONOUS ANGLE COUNTER

This is a continuation of U.S. application Ser. No. 07/103,861, filed Oct. 1, 1987, now abandoned, which is a continuation-in-part of U.S. application Ser. No. 036,049, filed Apr. 8, 1987, which has been issued as U.S. Pat. No. 4,814,704. The priority for all claimed subject matter herein which is common to the above identified parent patent application is hereby claimed.

FILED OF THE INVENTION

The present invention relates generally to angle counting systems, and, more particularly, to a circuit for counting and referencing angular positions on a rotating shaft.

DESCRIPTION OF THE PRIOR ART

Angle counting circuits are well known. For example, an angle counting circuit is sometimes used in a vehicle electronic ignition system to establish ignition timing. The ignition timing is typically generated by a sensor set up to detect the movement of teeth on a geared tooth wheel mounted on the engine crankshaft. As the wheel rotates, the sensor determines the position of the wheel by counting the number of teeth that pass by. The spacing of the teeth along the periphery of the wheel allows the angle counting circuit to approximate, through interpolation, when a tooth will pass by the sensor. This type of approximation is particularly useful in the absence of a tooth because the requisite timing signals the circuit generates are necessary at all times.

Unfortunately, there are problems relating to the position of the wheel that the above described circuit does not overcome. One problem involves the acceleration and deceleration of the wheel. As the wheel rotation accelerates, for example during power up or engine acceleration, such an interpolation is inaccurate due to the variance of the angle spacing over time. In this instance, the approximation would be ahead of the correct tooth position. As the wheel rotation decelerates, for example during engine deceleration, such an interpolation is inaccurate as the approximation would be behind the correct tooth position.

Another problem involves the manufacture of the wheel itself. Since the teeth are not always equally positioned along the periphery of the wheel, an interpolation method based on the spacing between several of the teeth will not always provide an accurate approximation of a correct tooth position.

The importance of an accurate angle counting system is also recognized where a reliable future estimation of a wheel position is required. For example, in a fuel injection system, it is desirable to release fuel for a time period which is based on the ignition timing. This is typically accomplished by actuating a fuel pump solenoid for a fixed period of time. Since the solenoid takes some period of time to actuate, the solenoid should be actuated slightly ahead of the desired fuel release time. If this timing can be reliably estimated, independent of acceleration/deceleration or tooth spacing, the fuel efficiency can be significantly improved.

Accordingly, an angle counting system is needed which overcomes these deficiencies.

SUMMARY OF THE INVENTION

It is an object of the present invention to provide an angle counting circuit for a rotating rotor whose output provides an accurate indication of rotor position in the presence of acceleration or deceleration of the shaft.

It is an additional object of the present invention to provide an angle counting circuit for a rotating rotor having a plurality of spaced markings whose output is designed to compensate for improper spacing of the markings positioned on the rotor.

It is yet another object of the present invention to provide a microcomputer controlled angle counting system for a rotating rotor which can accurately estimate the future position of the rotor with minimal microcomputer intervention.

The present invention may briefly be described in terms of a preferred embodiment involving a system for accurately measuring the angle of a rotating rotor having a reference marking as well as a plurality of markings spaced about the rotor periphery. The embodiment includes an angle measuring device for accurately indicating the position of the rotor relative to the reference position in view of perceived changes of rotor speed, i.e., actual changes in rotor speed as well as improper spacing of rotor markings. The measuring device includes a sensor for detecting the markings and generating a sensor signal in response thereto, and an angle counter, responsive to the sensor signal, for generating a position signal. A correcting circuit is provided which is responsive to the sensor signal for correcting the position signal so as to provide an accurate indication of the position of the rotor.

BRIEF DESCRIPTION OF THE DRAWINGS

The features of the present invention which are believed to be novel are set forth in the appended claims. The invention, together with further objects and advantages thereof, may best be understood by making reference to the following description taken in conjunction with the accompanying drawings, in which like reference numerals identify like elements, and wherein:

DETAILED DESCRIPTION OF THE PREFERRED EMBODIMENT

Figure 1:
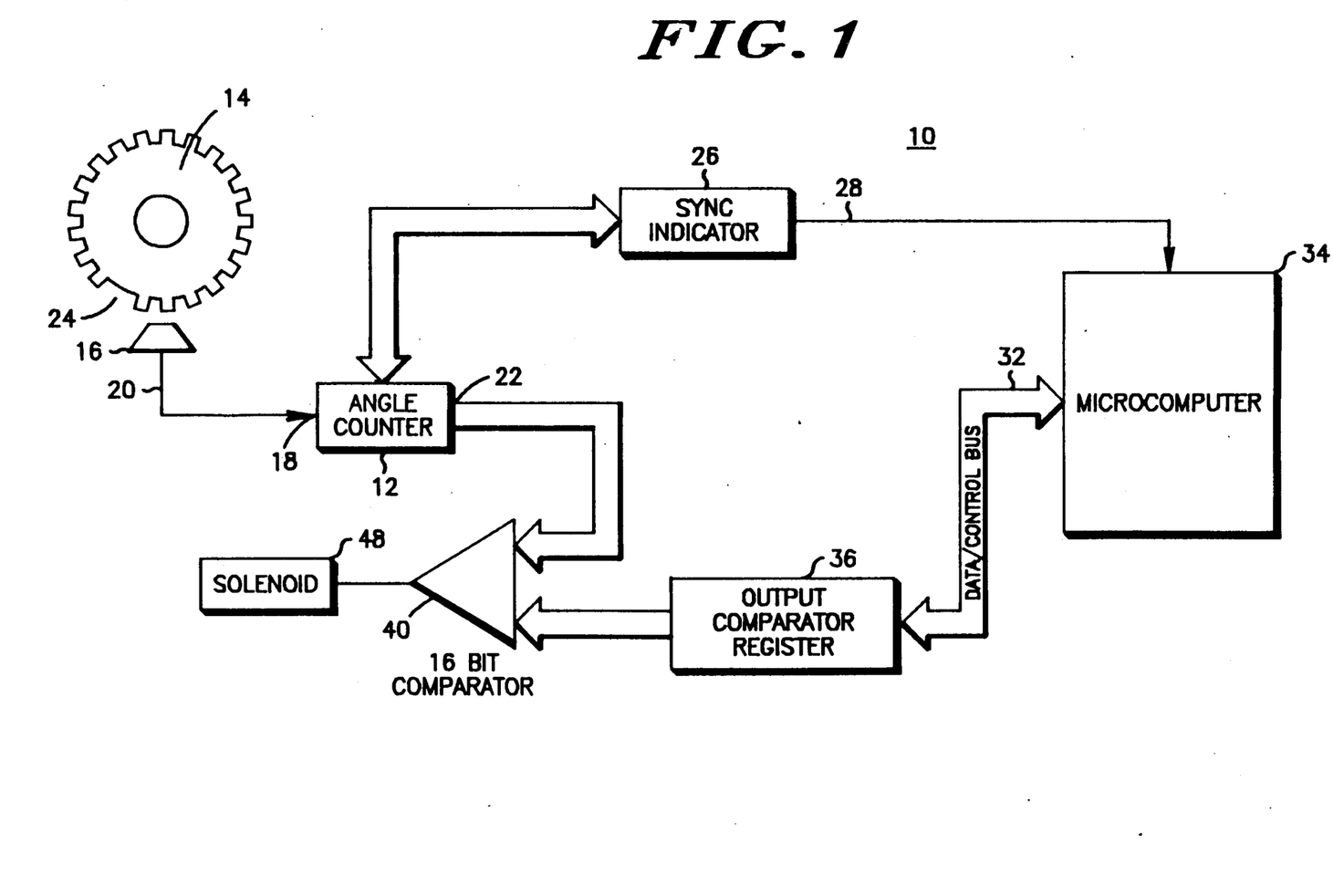
FIG. 1 is a block diagram of a system for estimating the future or present position of a rotating rotor, according to the present invention.

In FIG. 1, a synchronous angle counting system 10 is shown which is designed to correlate the physical angle, or position, of a geared rotor (wheel) 14 with an external event. The angle counter 12 is a primary element in the system 10 and may be used with the surrounding circuitry depicted in FIG. 1 to predict precise angular positions of the rotor for external events. For example, when the system is used for engine ignition timing, the system may be used to actuate a fuel pump solenoid 48 at a precise top-dead-center (TDC) ignition position. In the embodiment of FIG. 1, a microcomputer 34 establishes the actuation of the solenoid 48 at the precise requisite angle using the angular position indicated by the angle counter 12.

The microcomputer 34 establishes this actuation by preloading an output compare register 36 with the desired angle so that when the angle counter 12 indicates that the desired angle has been reached, the solenoid 48 will be actuated. Preferably, the desired angle is chosen to allow the solenoid 48 sufficient reaction time so as to appropriately inject the fuel at a TDC position. As previously discussed, such control is extremely beneficial as it may be used to improve the fuel efficiency and/or the general operation of the engine. A more detailed description of the system 10 is now described wherein the angle counter 12 is the focal point.

The angle counter 12 utilizes a sensor 16 connected at its input port 18 for generating a tooth edge signal on the lead 20, consisting of a brief high pulse, at each occurrence (passing) of a marking on the rotor 14 (in this application at each passing of a tooth). An output port 22 of the angle counter 12 is used to provide a 16 bit number which represents the precise angular position of the rotor 14. A missing tooth reference 24 is detected by the angle counter 12 to cause the 16 bit signal to restart its counting, beginning at zero, at each revolution. The detection of the missing tooth reference 24 will be discussed in detail with reference to FIGS. 2 and 3.

The 16 bit signal output at port 22 is coupled to a comparator 40 and employed by the microcomputer 34 to actuate the external event, such as triggering fuel pump injection through the solenoid 48, in a predictive manner. Once the rotor 14 is rotating, a sync indicator 26 generates a signal, on lead 28, indicating when the angle counter is synchronized to the rotation of the rotor. In response to this synchronization indication, the microcomputer 34 programs the output comparator register 36 with the number representative of the angle at which the solenoid should be actuated. As the angle counter 12 produces the 16 bit signal indicating the position of the rotor 14, the comparator 40 actuates the solenoid 48 when the number programmed into the output comparator register 36 is equal to the number generated by the angle counter 12.

For example, if the number latched into the output comparator register 36 is equal to 15.125 (decimal), then when the angle counter 12 indicates that the rotor 14 has reached the corresponding angle, the 15.125 number will be provided at the other input of the comparator 40 and the solenoid will be actuated.

The 16 bit signal output from the angle counter 12 is actually a binary number which consists of a 12 bit "integer part" and a 4 bit "fractional part". The integer part is incremented once for each sensed tooth. Between any pair of sensed teeth, the fractional part is incremented at evenly spaced time intervals determined by the period (the time period between the occurrence of two teeth as sensed by the sensor 16) between the previous two teeth.

All increments of the fractional part are evenly spaced over time, provided that the current tooth period is exactly equal to the previous tooth period. This provision constitutes an "ideal" condition which will occur only under steady state operation with equal tooth spacing (where no perceived changes of speed are present). During this ideal condition, for every tooth period, the number of increments of the fractional part will reach its maximum and cause the fractional part to roll over to zero precisely when the integer part increments by 1.

Figure 4:
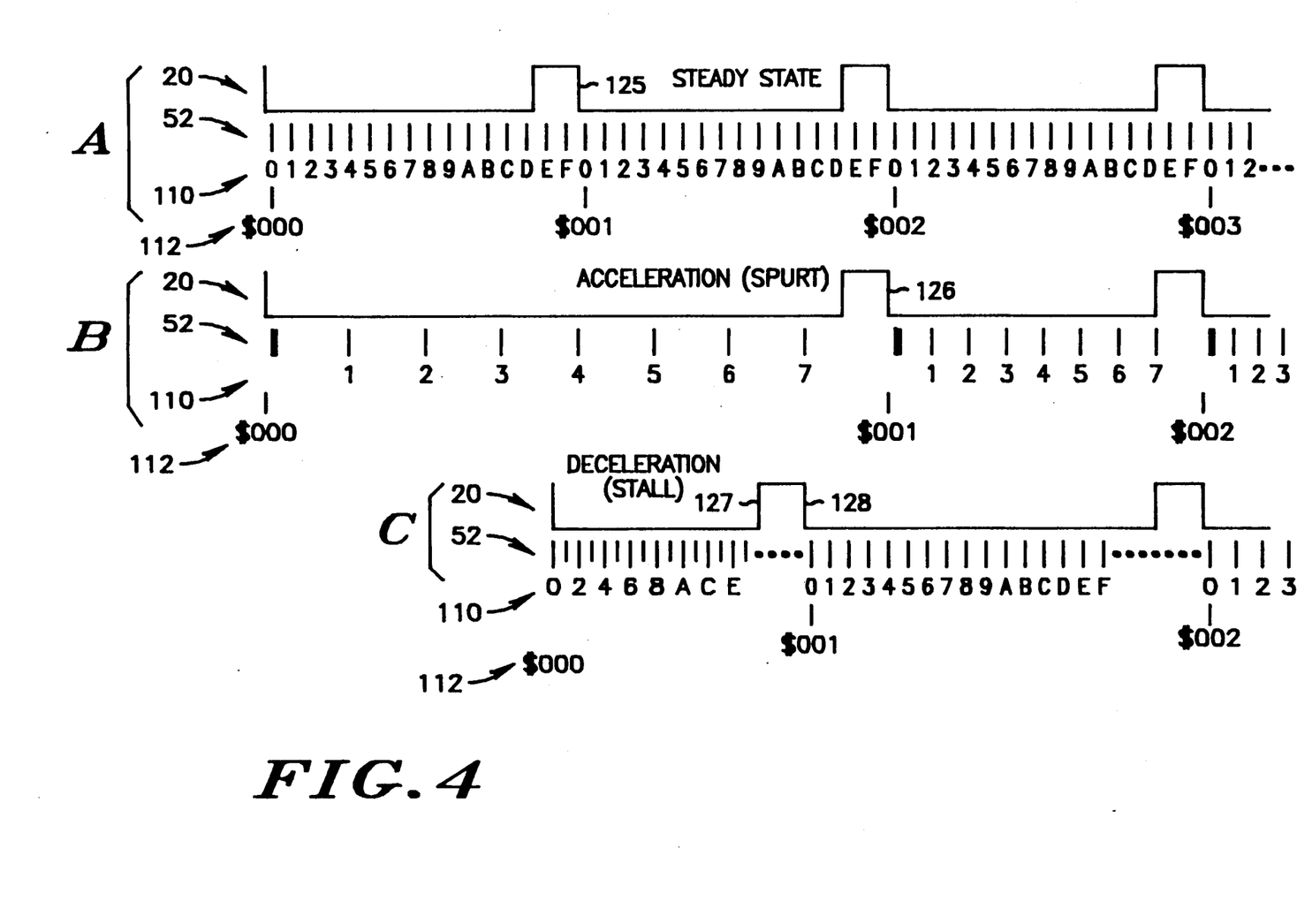
FIG. 4 comprises three timing diagrams depicting the counting operation at the output of the circuit shown in FIGS. 2 and 3.

Timing diagram A of FIG. 4 is illustrative. The hexadecimal representation 112 of the integer part of the 16 bit signal is located directly below the representation 110 of the fractional part. The tooth edge signal (generated by the sensor 16 of FIG. 1) is illustrated as a waveform 20, while an output signal 52 is represented by the evenly spaced vertical lines (generated as will be described with reference to FIG. 2). The falling edge 125 of the tooth edge signal 20 indicates where the roll over occurs. This is where the hexadecimal representation 110 of the fractional part changes from $F ("$" represents hexadecimal form) to $0, and the hexadecimal representation 112 of the integer part changes from $000 to $001. The even spacing of the output signal 52 illustrates that the teeth of the rotor are evenly spaced and that no acceleration or deceleration activity is present.

Accordingly, under ideal conditions, the 16 bit signal represents a modulo 16 binary number in a normal counting sequence. Because there are no perceived changes in rotor speed, no compensation to the counting process is necessary. This is not the case, however, when perceived changes in rotor speed are detected.

When such perceived changes in rotor speed are detected, the system corrects the counting process after each sensed tooth. Under acceleration or uneven tooth spacing, where a smaller tooth period follows a larger tooth period, the fractional part will not be ready to roll over when the next tooth is sensed. Thus, a provision is made to correct, in this case "spurt", the fractional part so as to allow correction to the entire 16 bit signal.

This spurting correction is accomplished by forcing the fractional part of the 16 bit signal to "spurt" ahead when the falling edge of the tooth signal 20 is detected. At timing diagram B of FIG. 4, the "spurt" condition is illustrated at the falling edge 126 of the tooth edge signal 20. At this point, the next tooth is sensed and it has been determined that the fractional part has not counted to its maximum. The hexadecimal representation 110 of the fractional part of the 16 bit signal does not reach $F in this illustration; the angle counter only had enough time to count to $7.

Consequently, the fractional part is spurted ahead until the hexadecimal representation 112 of the integer part is incremented. By spurting the fractional part at this point, the integrity of the counting process is not disturbed as a result of the shortened tooth period.

Conversely, under deceleration or uneven tooth spacing, where a larger tooth period follows a smaller tooth period, the fractional part would have been ready to roll over sometime before the next tooth passes. Thus, another provision is made to correct the 16 bit signal by "stalling" the counter until the next tooth is detected.

The stalling mode is illustrated in timing diagram C of FIG. 4. Just before the rising edge 127 of the tooth edge signal 20, the hexadecimal representation 110 of the fractional part indicates where the output signal 52 begins to stall. At this point the fractional part has already counted to $F but the next tooth edge has not yet arrived. The hexadecimal representation 112 of the integer part indicates that the 16 bit signal is counting normally once the next tooth edge arrives, as indicated at the falling edge 128 of the tooth edge signal 20.

Although there are many ways to implement the "spurt", "stall", "detection", and "correction" features described above, the circuit in FIGS. 2 and 3 describes the preferred implementation. More particularly, FIGS. 2 and 3 illustrate the angle counter 12, of FIG. 1, in expanded form.

Figure 2:
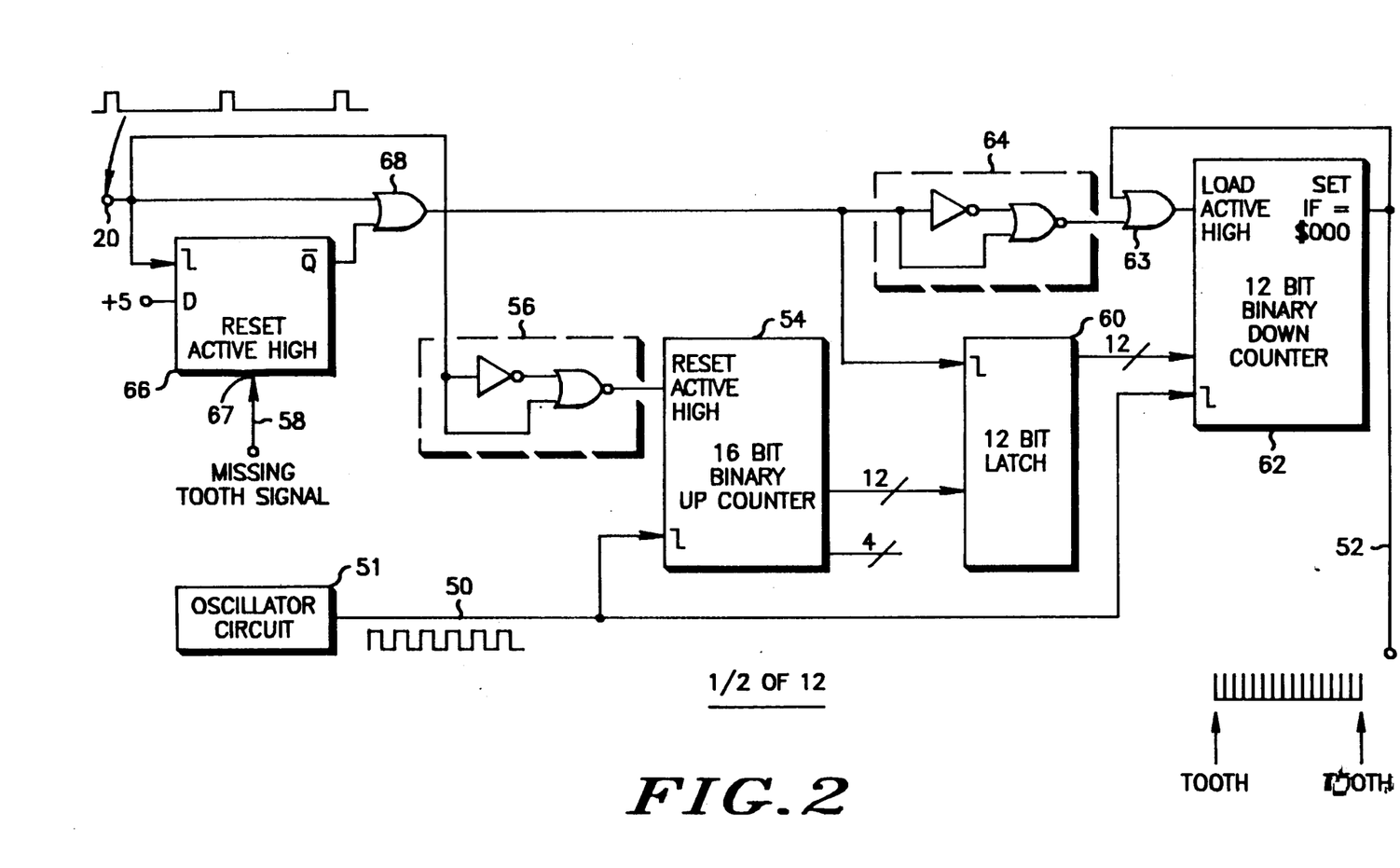
FIGS. 2 and 3 comprise a circuit diagram, according to the present invention, for implementing block 12 of FIG. 1.
Figure 3:
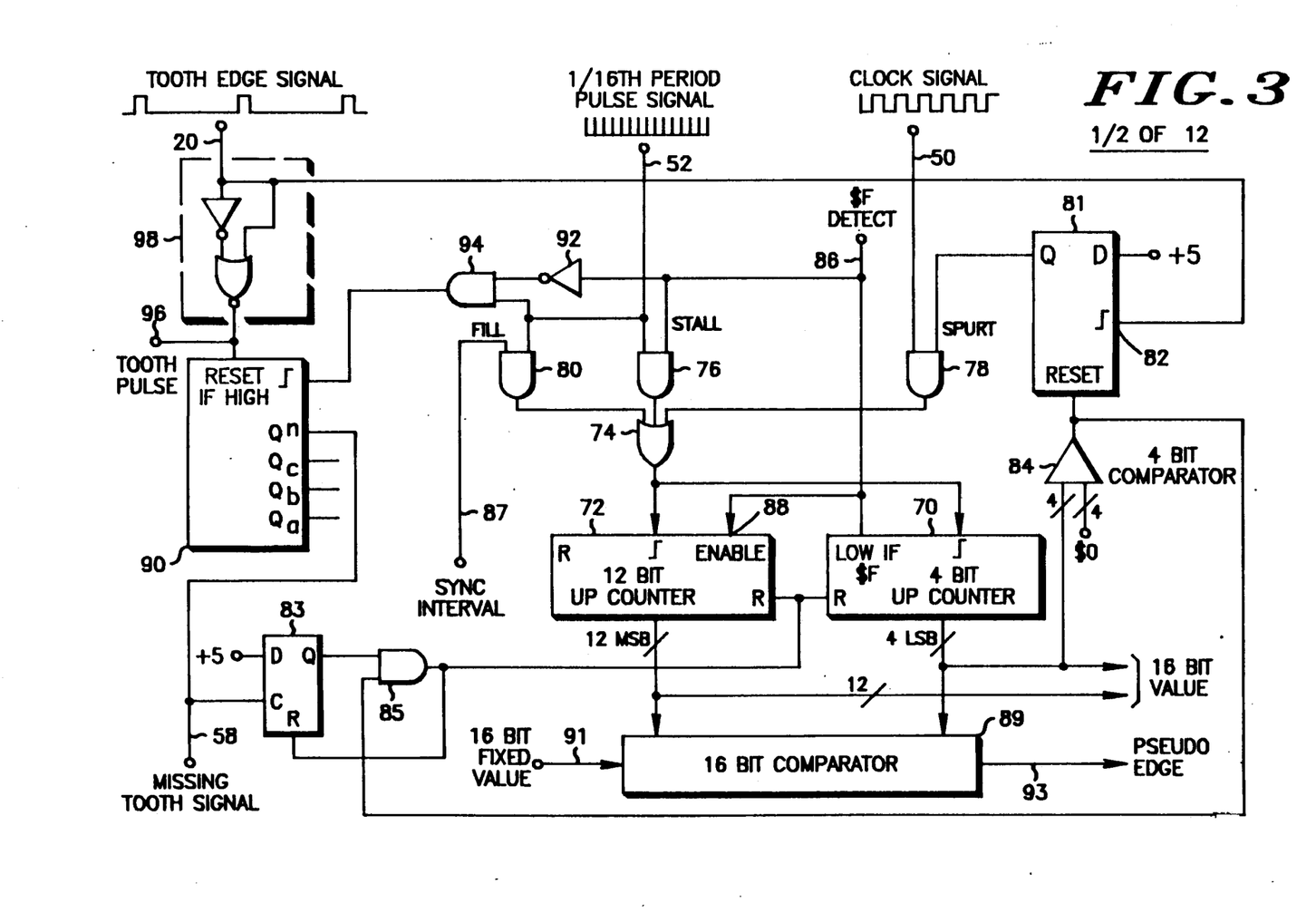

In FIG. 2 the tooth edge signal 20, generated for each sensed rotor tooth, is combined with a high speed clock signal 50 (4.0 MHz), generated from an oscillator circuit 51, to produce an output signal 52 that pulses 16 times for every sensed tooth period. The output signal 52 is used to interpolate the angle between teeth and to establish the basic counting operation for the 16 bit signal discussed above. The tooth edge signal 20 is represented by a negative going pulse which occurs coincident with the geometric center of each passing tooth.

On every occurrence of the tooth edge signal 20, a 16 bit up counter 54 is reset (cleared). This is accomplished by coupling the tooth edge signal 20 to the 16 bit up counter 54 through a negative edge detector circuit 56. The 16 bit up counter 54 is then incremented by the high speed clock signal 50 during the period between teeth. After two consecutive tooth edge signals 20 without a missing tooth signal on lead 58, subsequently discussed, the integer part (12 most significant bits) of the 16 bit up counter 54 is latched into a 12 bit latch 60, prior to the next clearing of the 16 bit up counter 54. The 12 bit latched number is then transferred to a 12 bit down counter 62 and decremented by the clock signal 50 to zero. (The latch 60 should be initialized on power up to $FFF.)

The latched 12 bit signal is loaded into the 12 bit down counter 62 at one of three occurrences so as to reinitialize the counter 62 after every "effective" detection of a tooth on the rotor 14. The first occurrence is at the negative going edge of the tooth edge signal 20. This is the result of another negative edge detector circuit 64 coupling the tooth edge signal 20 to the LOAD input of the counter 62 through OR gates 68 and 63. This "load" ensures that the down counting performed by the counter 62 is reinitialized after every actual detection of a tooth.

The second occurrence is when the output signal 52 is generated. The output signal 52 is generated when the fractional part of the 16 bit signal reaches zero. This is accomplished by coupling the output signal 52, provided by the counter 62, to its LOAD input through the OR gate 63. Decrementing the 12 bit latched number to zero will take 1/16th the time it took to increment the entire 16 bit quantity to its maximal number. Hence, this "load" ensures that the counter 62 will reinitialize its down counting after it has determined that a tooth should have been detected so as to establish equal periods between the output signals 52. Of course this means that the number of output signals 52 for each tooth period is dependent upon the previous tooth period. In fact, the output signal 52 has special characteristics depending on the relation between the previous and current tooth periods. If the current tooth period is less than the previous tooth period, less than 16 pulses will occur. If the current tooth period is greater than the previous tooth period, 16 or more pulses will occur. This applies to cases having even the slightest deviation between tooth periods. This is because the down counting action of the counter 62 occurs nearly coincident with the next tooth active edge. If the current tooth period is shortened even by the smallest amount, for example as a result of acceleration, the output signal 52 may not be generated for that tooth period.

The latched 12 bit signal is also loaded into the 12 bit counter 62 when the missing tooth reference 24 (FIG. 1) is detected. The missing tooth signal is provided on lead 58 to a D flip-flop 66. This loading is necessary because the output signal 52 has a period which is based on the time between previous tooth detections. Once the missing tooth is detected, the output signal 52 must be normalized so as not to represent an excessive previous tooth interval.

More particularly, the missing tooth correction to the output signal 52 is performed after the 2nd tooth active edge following the missing tooth signal. This is accomplished by using the D flip flop 66 in conjunction with the OR gate 68; the missing tooth signal resets the D flip flop 66 at input port 67 each time a tooth is sensed such that its inverted Q output causes the circuit 64 to "load" the 12 bit signal in counter 62. The missing tooth signal remains high from the point of detection until after the next (first) tooth edge signal 20 is generated. Since the missing tooth signal on lead 58 is applied to the RESET input port 67 of the D flip flop 66, the inverted Q output and the output of the OR gate 68 are also forced high from the point of detection until after the first occurrence of the tooth edge signal 20. At the second occurrence of the tooth edge signal 20 and on its negative edge, the inverted Q output of the D flip flop 66 and the output of the OR gate 68 both change to the low state. Since this edge is the edge which causes the immediate latching of the top 12 bits of the up counter 54 into the 12 bit latch 60, and also the immediate reset of the up counter 54, the 12 bits must be latched into the latch 60 prior to resetting the up counter 54. This requires that the propagation delay for the D flip flop 66 plus the propagation delay of the OR gate 68 be less than the delay required to reset the up counter 54.

Once the inverted Q output of the D flip flop 66 returns low, a new period measurement will be made by the counters 54 and 62 with each sensed tooth edge signal 20.

Referring now to FIG. 3, the high speed clock signal 50 (from the oscillator circuit 51 in FIG. 2), the tooth edge signal 20, and the output signal 52 (the interpolation output provided by the counter 62 in FIG. 2) are combined to produce the 16 bit signal at the output port 22 of the angle counter 12 (FIG. 1). The 16 bit signal is generated by a 4 bit up counter 70 which represents the "fractional" part, and a 12 bit up counter 72 which represents the "integer" part, previously discussed. The 16 bit signal can be incremented by only two sources, by either the output signal 52 or the high speed clock signal 50. Both signals 50 and 52 are coupled to the counters 70 and 72 through a 3-input OR gate 74.

The output signal 52 is coupled to the OR gate 74 so as to increment the counter 70 sixteen times between teeth. A first AND gate 76 is provided between the output signal 52 and the counters 70 and 72 to prevent counting during the "stall" mode (during decelerations or excessive tooth spacings).

The clock signal 50 is coupled to the 3-input OR gate 74 through a second AND gate 78 in order to "spurt" ahead the counters 70 and 72 (during accelerations or close tooth spacings).

Additionally, a third AND gate 80 is used to couple the output signal 52 to the counters 70 and 72 in combination with a signal 87 (indicating the anticipated missing tooth reference 24 interval) in order to "correct" or "fill" the counter 70 with additional increments during the period of the missing tooth reference 24.

At start-up, the counters 70 and 72 begin at some random number. If the "fractional part", output from counter 70, is not equal to a hexadecimal zero ($0), then after the next tooth edge signal 20 the counter 70 will be incremented until it rolls over to zero. This is accomplished through the use of a D flip-flop 81 in combination with the clock signal 50.

The D flip flop 81 is coupled to the tooth edge signal at its (negative edge triggered) clock input port 82 such that it generates a high-level output signal, indicating the occurrence of the tooth edge signal, until the counter 70 produces a $0 output, at which time the D flip flop 81 is reset by a 4 bit comparator 84 detecting this condition. This high speed incrementing operation is referred to as the "spurting" action, previously discussed and illustrated with timing diagram B of FIG. 4.

This spurting action continues until the 4 bit "fractional part" rolls over to zero, and the 12 bit "integer part" increments by 1. The roll over action by the counters 70 and 72 is accomplished by the conventional technique of connecting a $F detect signal 86 (active low) from the counter 70 to an enable input port 88 of the counter 72. In essence, the spurting action ensures that the counter 70 returns to $0 and that the counter 72 increments by one after each tooth edge signal 20.

The output signal 52 should then be valid after the 2nd tooth active edge following power up, assuming a minimum rotor velocity. Based on the structure shown in FIG. 2, the first pulse of the output signal 52 is spaced 1/16th of the previous period from the most recent tooth active edge. The output signal 52 will increment the counter 70 at this 1/16th period interval until the "fractional part" of the 16 bit signal reaches $F. At this point the angle counter 12 enters a "stall" condition, as previously discussed and illustrated with the third timing diagram of FIG. 4.

The stall condition is accomplished by connecting the $F detect output signal 86 to an input of the AND gate 76, thereby blocking any additional increments to the counter 70 by the output signal 52. When the stall condition begins, the high speed clock signal 50 is inhibited from incrementing the counters 70 and 72 because the flip-flop 81 disables the spurt input to the AND gate 78. However, at the next occurrence of the tooth edge signal 20, the flip flop 81 will enable the spurt input to the AND gate 78 so as to increment the counters 70 and 72 once, and break the stall condition.

The 1/16 period pulse signal 52 is connected to the counters 70 and 72 through the AND gate 80 and the OR gate 74. A second input, sync interval 87, to the AND gate 80 acts as an enable. When the counters 70 and 72 reach a predetermined 16 bit fixed value 91, the sync interval (lead 87) enables the AND gate 80. The sync interval is provided by the circuit shown in FIG. 5 and will be discussed therewith.

When in the stalled condition a missing tooth detection up counter 90 is incremented for each output signal 52. This is accomplished by inverting the $F detect signal 86 through a gate 92 and coupling it to an input of an AND gate 94. The other input of the AND gate 94 receives the output signal 52 such that only after the stall condition is detected does the counter 90 begin counting pulses of the output signal 52.

The counter 90 is a 4 bit counter configured such that it does not roll-over in a modulo roll-over manner. Thus, once the missing tooth signal on lead 58 is activated, it remains activated until the counter 90 is reset by the next tooth edge signal 20.

The counter 90 is reset by the tooth edge signal 20 through another negative edge detection circuit 98.

This allows the counter 90 to be cleared (reset) after each tooth edge signal 20. If the absence of the tooth edge signal 20 allows the counter to become incremented to a high enough level where decelerations may be discounted (the level is $8 in this circuit), the missing tooth reference 24 (FIG. 1) is detected, and a missing tooth signal on lead 58 is generated which, as previously indicated, remains high until after the next tooth edge signal 20.

During the period the missing tooth signal on lead 58 remains high, correction of the 16 bit signal is implemented. Correction is made by allowing the output signal 52 to increment the counters 70 and 72, through the AND gate 80 and the OR gate 74. The count at the output of counters 70 and 72 then proceeds at a rate determined as the previous rate. Then at the next occurrence of the tooth edge signal 20, the count "spurts" ahead until the fractional part reaches $0.

Before the fractional part reaches $0, the missing tooth signal 58 causes a flip-flop 83 to set. An AND gate 85 receives the output of the flip-flop 83 along with output of the comparator 84 such that when the fractional part reaches $0, the output of the AND gate 85 causes the counters 70 and 72 to reset to zero. The output of the AND gate 85 is also connected to reset the flip-flop 83 so that only a brief pulse is provided at the reset port of the counters 70 and 72.

The 16 bit signal provided at the output of the counters 70 and 72 is provided to the input of a 16 bit comparator 89 along with a 16 bit fixed number 91. The comparator 89 employs these inputs to generate a pseudo (tooth) edge signal on lead 93. The 16 bit fixed number 91 is established such that when the 16 bit signal provided by the counters 70 and 72 equals the fixed number 91, the pseudo edge signal on lead 93 initiates an interval during which the missing tooth reference 24 (FIG. 1) is expected. This interval, which terminates when a tooth pulse is detected or when the counter 70 reaches its maximum output ($F), is referred to as the "sync interval".

The sync interval signal provides correction to the 16 bit signal by allowing the output signal to update counters 70 and 72 (FIG. 3) through AND gate 80 after the counter 90 has reached its maximum $F (as illustrated and previously discussed with timing diagram D of FIG. 4). The sync interval signal also establishes the time during which synchronization is made between the angle counter 12 (FIG. 1) and the rotor 14.

Figure 5:
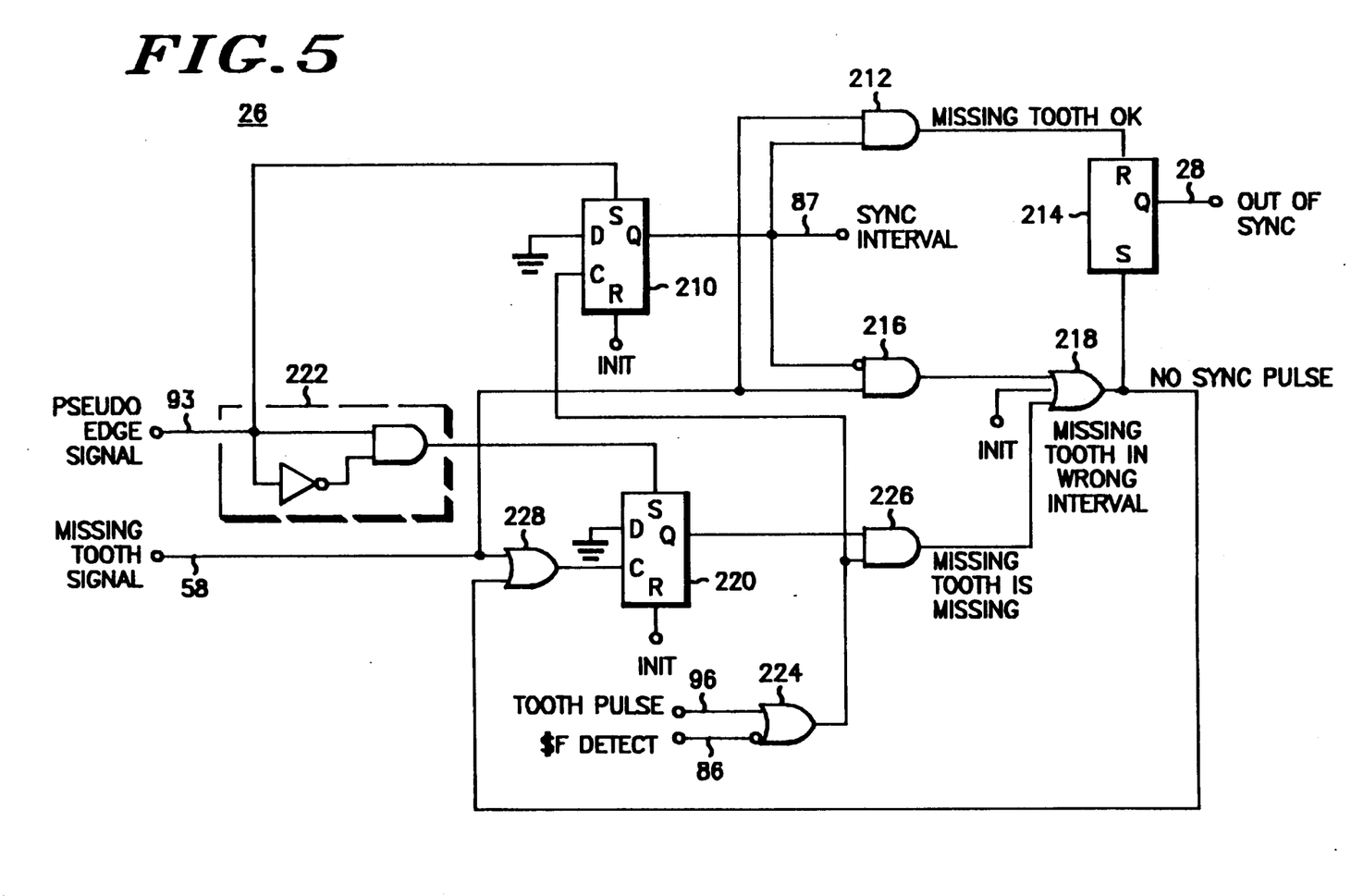
FIG. 5 is a circuit diagram, in accordance with the present invention, expanding block 26 of FIG. 1.

The synchronization circuit (sync indicator 26 of FIG. 1) is shown in expanded form in FIG. 5. The pseudo edge signal on lead 93 is connected to a flip-flop 210 such that the sync interval signal is generated on lead 87.

The sync indicator 26 (FIG. 1) provides an out of sync signal (lead 28 FIG. 1) to the microprocessor whenever the angle counter 12 (FIG. 1) is not synchronized to the rotor. This occurs whenever the missing tooth reference is not present during the "sync interval". There are two ways that this is detected: by detecting that the missing tooth reference is in the wrong interval, and by detecting that the missing tooth reference is not in the correct interval. Also, the circuit in FIG. 5 detects when the missing tooth reference is in the correct interval.

The latter detection is accomplished by ANDing the sync interval signal 87 with the missing tooth signal 58 at AND gate 212. When both signals are active, an out of sync flip-flop 214 is reset to indicate that the missing tooth reference is in the correct interval.

Detecting that the missing tooth reference is in the wrong interval is accomplished in a similar fashion. The sync interval signal 87 is inverted before it is ANDed with the missing tooth signal 58 at AND gate 216. If the output of AND gate 216 goes high, then the out of sync flip-flop 214 is set through an OR gate 218 to indicate that the missing tooth reference is in the wrong interval.

Detecting that the missing tooth reference is not in the correct interval is accomplished, in part, by combining the pseudo edge signal 93 with the missing tooth signal 58. When the pseudo edge signal goes active, indicating that the sync interval has just begun, a flip-flop 220 is set through a positive edge detector 222. This establishes the time period during which the missing tooth signal is expected. If the missing tooth signal does not occur before the period lapses, the flip-flop will not be reset, and the lapsing of the period will cause the out of sync flip-flop 214 to generate the out of sync signal.

The $F detect signal 86 (from the counter 70) is combined with a tooth pulse signal 96 (from the negative edge detector 98) by an OR gate 224 to indicate when the sync interval has lapsed. The tooth pulse signal 96 indicates that the interval has lapsed because a tooth edge signal has occurred, while the $F detect signal 86 indicates that the interval has lapsed because the counter 70 is already in the stall mode. The AND gate 226 sets the flip flop 214 through the OR gate 218 if the flip-flop 220 is still latched by the time the sync interval has lapsed.

The flip-flop 220 will not remain be latched by the time the sync interval has lapsed if it has been reset during this interval. The flip-flop 220 is reset when a missing tooth is detected or when the out of sync flip-flop is set. This is accomplished by ORing the missing tooth signal 58 with the signal at the SET port of the flip-flop 214 through OR gate 228.

Additionally, an initialization signal (INIT) is coupled to the flip-flops 210, 214 and 220 so that the angle counter "starts-up" indicating that it is unsynchronized.

Figure 6:
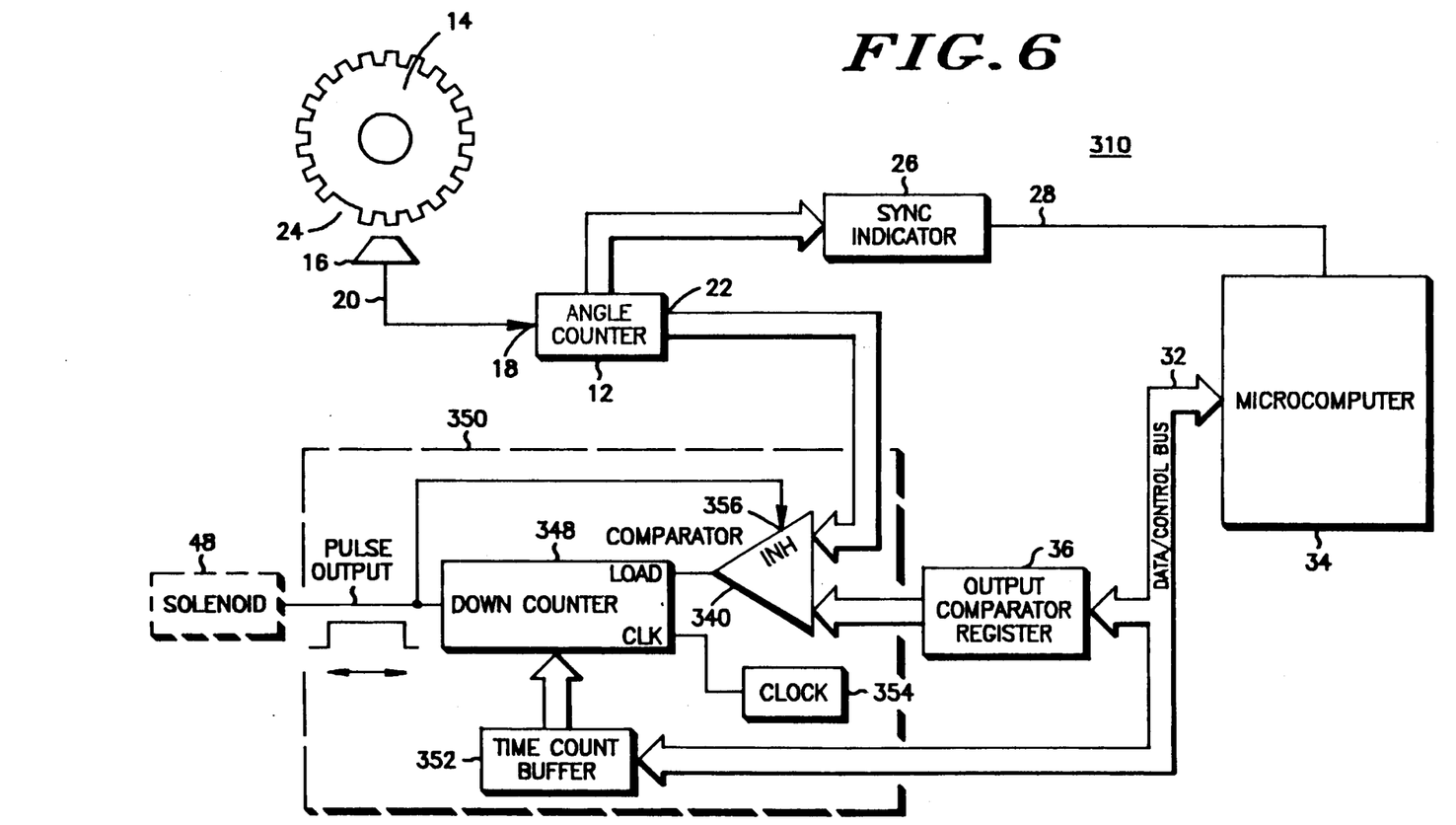
FIG. 6 is a block diagram of an alternate system for estimating the future or present position of a rotating rotor, according to the present invention.

FIG. 6 illustrates a modified version (310) of the system 10 shown in FIG. 1. The modification provides an angle initiated/time based pulse generator and includes replacing the comparator 40 from FIG. 1 with block 350. Block 350 includes a comparator 340, employed for the same functions as the comparator 40 FIG. 1, i.e. to compare the number output from the angle counter 12 with the number in the comparator register 36. At the output of the comparator 340, a downcounter 348 is employed to generate a pulse when the output of the comparator 340 goes active. The length of the pulse is established by a clock 354 and a time count buffer 352 which is initially programmed by the microcomputer 34. With the buffer 352 programmed for a predetermined period, when the angle counter 12 indicates that the rotor 14 is at the angle corresponding to the number in the output compare register 36, the comparator 340 loads the downcounter 348 with the contents of the buffer 352. Consequently, a pulse having the predetermined period is generated at the output of the downcounter 348 to actuate the solenoid 48.

The output of the downcounter is connected to the inhibit port 356 of the comparator 340 to prevent a subsequent load of the downcounter 348 before the predetermined period has lapsed.

The system 310 can be employed for a variety of applications where it is advantageous to programmably establish a time period in response to the angle counter reaching the desired angle. For instance, the circuit could be used for time based fuel injection or to establish the dwell period in a spark control application. Regardless of the type of application, because only initial programming is required by the microprocessor, the angle counting systems in FIGS. 1 and 6 require minimal attention once they have been programmed, thereby allowing the microprocessor ample time to handle other engine control functions.

The present invention therefore provides an angle counter which may synchronized to a rotating shaft. The angle counter operates independently of any microprocessor controls, but, as previously discussed, may be advantageously used with a microprocessor to predict precise positions of the rotor for actuating external events independent of accelerations, decelerations or abnormal tooth spacings in the wheel.

While the invention has been particularly shown and described with reference to a preferred embodiment, it will be understood by those skilled in the art that various other modifications and changes may be made to the present invention described above without departing from the spirit and scope thereof. For example, rather than reinitializing the 16 bit number each time the reference mark is detected, it would be an obvious alteration to reinitialize the 16 bit number after a predetermined number of reference markings have been detected.

What is claimed is:

1. In a system for measuring angle of a rotating rotor having rotor markings including a reference marking at a reference position on the rotor and a plurality of other markings spaced about the rotor, an angle measuring device for accurately indicating angular position of the rotor relative to the reference position in view of perceived changes of rotor speed, comprising:

means for detecting each of at least said other rotor markings and generating a signal pulse in response thereto;

interpolation means, responsive to said signal pulses, for indicating relative angular position of said rotor by providing a plurality of interpolated angular position signal pulses, having a rate of occurrence, between each of said sensor signal pulses;

counting means responsive to said sensor signal pulses and said interpolated angular position signal pulses, for generating a position signal which includes a binary number corresponding to a unique position of the rotor relative to the reference position; and correction means, responsive to time occurrences of said sensor signal pulses, for correcting said position signal by modifying the rate of occurrence of said interpolated angular position signal pulses;

whereby the position signal is corrected in response to the sensor signal pulses so as to provide accurate indication of the position of the rotor.

2. An angle measuring device for measuring the angle of a rotating rotor, according to claim 1, wherein said correction means includes means for detecting perceived accelerations and for forcing said position signal to spurt ahead, and includes means for detecting perceived decelerations and for forcing said position signal to stall.

3. An angle measuring device for measuring the angle of a rotating rotor, according to claim 1, further including reinitialization means for detecting the reference marking and for reinitializing said position signal in response to the reference marking being detected.

4. An angle measuring device for measuring the angle of a rotating rotor, according to claim 1, wherein said correction means includes timing means for measuring the time between said sensor signal pulses and comparison means for comparing at least one of said measured times against at least one predetermined value.

5. An angle measuring device for measuring the angle of a rotating rotor, according to claim 4, wherein said at least one predetermined value includes a value representative of a time period after which a sensor signal is expected.

6. An angle measuring device for measuring the angle of a rotating rotor, according to claim 4, wherein said at least one predetermined value includes a value representative of a previously measured time between sensor signals.

7. An angle measuring device for measuring the angle of a rotating rotor, according to claim 1, wherein said position signal is a binary number which is capable of reaching a number substantially greater than the number of markings on the rotor during one revolution thereof.

8. An angle measuring device for measuring the angle of a rotating rotor, according to claim 7, wherein said binary number comprises an integer part and a fractional part.

9. An angle measuring device for measuring the angle of a rotating rotor, according to claim 8, wherein said correction means includes means for stalling the fractional part of the binary number until another sensor signal is generated by the sensor means.

10. An angle measuring device for measuring the angle of a rotating rotor, according to claim 8, wherein said correction means includes means for spurting the fractional part of the binary number until the integer part of the binary number is incremented.

11. An angle measuring device for measuring the angle of a rotating rotor, according to claim 1, wherein said counting means includes;
    timing means for measuring the time between said sensor signal pulses, and
    interpolation means, responsive to said time measured between said sensor signal pulses, for generating a signal to said correction means indicative of relative angular position of the rotor between sensor signal pulses.

12. In a system for measuring angle of a rotating rotor having rotor markings including a plurality of markings spaced about the rotor and a missing marking reference position, an angle measuring device for accurately indicating angular position of the rotor relative to the reference position, comprising:
    sensor means for detecting each of the rotor markings and generating a sensor signal pulse in response thereto;
    interpolation means, responsive to said signal pulses, for indicating relative angular position of said rotor between sensor signal pulses by providing a plurality of interpolated angular position signal pulses, having a rate of occurrence, between each of said sensor signal pulses; and
    counting means responsive to said sensor signal pulses and said interpolated angular position signal pulses, for generating a position signal which includes a binary number corresponding to a unique position of the rotor relative to the reference position; and
    correction means, responsive to time occurrences of said sensor signal pulses, for correcting said position signal such that the position signal is compensated for perceived changes of rotor speed by modifying the occurrence rate of said interpolated angular position signal pulses, whereby the corrected position signal is accurately representative of the angular position of the rotor relative to the reference position.

13. An angle measuring device for measuring the angle of a rotating rotor, according to claim 12, wherein said correction means corrects said position signal based on time period between previous sensor signal pulses.

14. An angle measuring device for measuring the angle of a rotating rotor, according to claim 12, further including means, responsive to said sensor signal pulses, for detecting the missing marking reference position and resetting the position signal in response thereto.

15. An angle measuring device for measuring the angle of a rotating rotor, according to claim 12, wherein said counting means includes means for correcting said position signal at the missing marking reference position.

* * * * *